(12) United States Patent
Kung et al.

(10) Patent No.: US 11,670,622 B2
(45) Date of Patent: Jun. 6, 2023

(54) STACKED SEMICONDUCTOR PACKAGE AND PACKAGING METHOD THEREOF

(71) Applicant: Powertech Technology Inc., Hukou Township, Hsinchu County (TW)

(72) Inventors: Yin-Huang Kung, Hukou Township, Hsinchu County (TW); Chia-Hung Lin, Hukou Township, Hsinchu County (TW); Fu-Yuan Yao, Hukou Township, Hsinchu County (TW); Chun-Wu Liu, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 15 days.

(21) Appl. No.: 17/210,452

(22) Filed: Mar. 23, 2021

(65) Prior Publication Data

US 2022/0165709 A1 May 26, 2022

(30) Foreign Application Priority Data

Nov. 20, 2020 (TW) .................................. 109140719

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/0651* (2013.01); *H01L 2225/06575* (2013.01); *H01L 2225/06586* (2013.01)

(58) Field of Classification Search
CPC ........................... H01L 25/0657; H01L 25/50
See application file for complete search history.

(56) References Cited

U.S. PATENT DOCUMENTS

| | | | |
|---|---|---|---|
| 9,905,519 B1* | 2/2018 | Chang | H01L 23/3128 |
| 2011/0186998 A1* | 8/2011 | Wu | H01L 25/0657 |
| | | | 257/738 |
| 2017/0249493 A1* | 8/2017 | Yu | H01L 24/11 |
| 2018/0061788 A1* | 3/2018 | Chang | H01L 24/20 |
| 2018/0076131 A1* | 3/2018 | Hsu | H01L 23/3128 |
| 2021/0082810 A1* | 3/2021 | Chen | H01L 23/49833 |
| 2021/0082895 A1* | 3/2021 | Miura | H01L 24/83 |
| 2021/0183777 A1* | 6/2021 | Yim | H01L 23/5384 |
| 2022/0165709 A1* | 5/2022 | Kung | H01L 24/32 |

FOREIGN PATENT DOCUMENTS

| | | |
|---|---|---|
| TW | 200522284 A | 7/2005 |
| TW | 201839927 A | 11/2018 |

* cited by examiner

*Primary Examiner* — Thao P Le
(74) *Attorney, Agent, or Firm* — patenttm.us

(57) ABSTRACT

A stacked semiconductor package has a substrate, a first chip, at least one spacer, a second chip and an encapsulation. The first chip and the second chip are intersecting stacked on the substrate. The at least one spacer is stacked on the substrate to support the second chip. The encapsulation is formed to encapsulate the substrate, the first chip, the at least one spacer and the second chip. The at least one spacer is made of the material of the encapsulation. Therefore, the adhesion between the at least one spacer and the encapsulation is enhanced to avoid the delamination during the reliability test and enhances the reliability of the stacked semiconductor package.

16 Claims, 11 Drawing Sheets

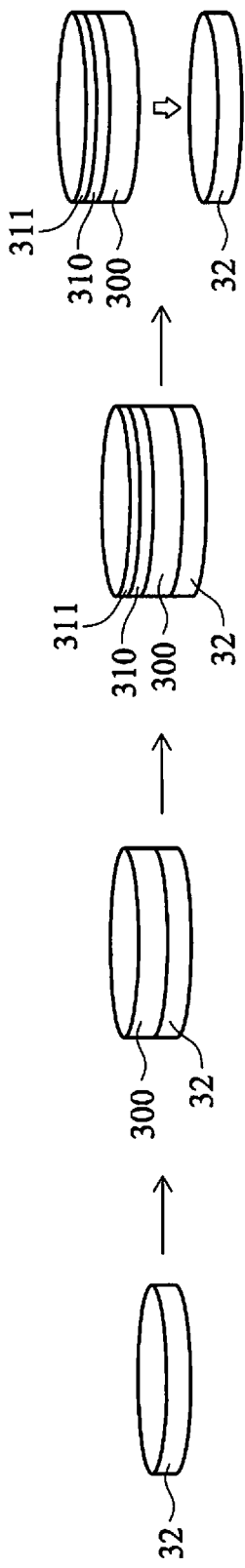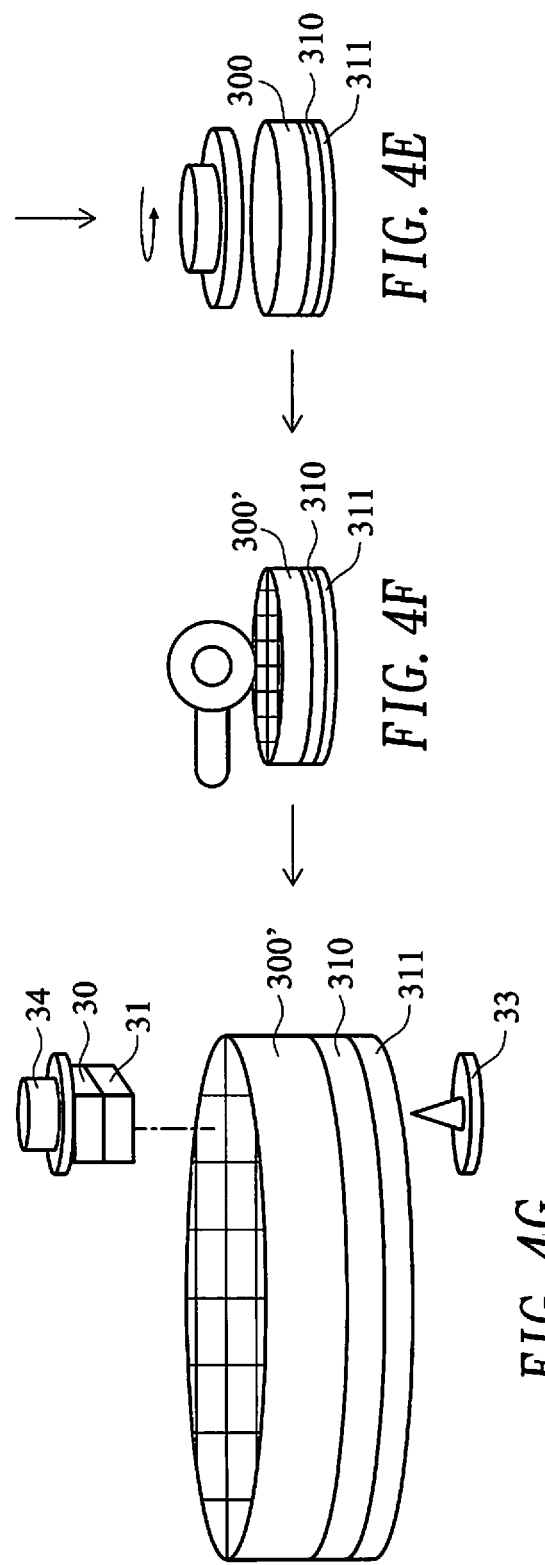

STACKED SEMICONDUCTOR PACKAGE AND PACKAGING METHOD THEREOF

CROSS-REFERENCE TO RELATED APPLICATIONS

This application is based upon and claims priority under 35 U.S.C. 119 from Taiwan Patent Application No. 109140719 filed on Nov. 20, 2020, which is hereby specifically incorporated herein by this reference thereto.

BACKGROUND OF THE INVENTION

1. Field of the Invention

The present invention is related to a stacked semiconductor, and more particularly to a stacked semiconductor package has a spacer and a packaging method thereof.

2. Description of the Prior Arts

In the semiconductor package technology, a stacked semiconductor package is provided to decrease the size and the power consumption and to enhance the reliability and the safety.

With reference to FIG. 5, a conventional stacked semiconductor package 60 in accordance with the prior art has a substrate 61, a first chip 62, a second chip 63, a silicon spacer 64 and an encapsulation 65. The first chip 62 and the silicon spacer 64 are mounted on the substrate 61. The second chip 63 is stacked on the first chip 62. A side 630 of the second chip 63 protrudes from a side 620 of the first chip 62 to expose a pad 621 of the first chip 62. The side 630 is stacked on the silicon spacer 64 to enhance the stability of the second chip 63. The encapsulation 65 is formed on the substrate 61 to encapsulate the first chip 62, the second chip 63 and the silicon spacer 64.

After the stacked semiconductor package 60 is tested by the reliability test, the silicon spacer 64 and the encapsulation 65 are found delamination to result product failure. The delamination is cause by poor adhesion strength between the silicon spacer 64 and the encapsulation 65, so the reliability of the stacked semiconductor package 60 is reduced.

To overcome the shortcomings, the present invention provides a stacked semiconductor package and a packaging method thereof to mitigate or to obviate the aforementioned problems.

SUMMARY OF THE INVENTION

An objective of the present is to provide a stacked semiconductor package and a packaging method thereof to obviate the aforementioned problems.

To achieve the objective as mentioned above, the stacked semiconductor package comprising:
 a substrate;
 a first chip mounted on the substrate;
 at least one spacer mounted on the substrate and disposed on at least one side of the first chip;
 at least one gap, each one of the at least one gap formed between a corresponding one of the at least one spacer and a corresponding one of the at least one side of the first chip;
 a second chip mounted on the first chip and the at least one spacer; and
 an encapsulation formed on the substrate to encapsulate the first chip, the at least one spacer and the second chip and filling the at least one gap, wherein the material of the encapsulation and the at least one spacer are the same.

From the above description, the second chip is stacked on the first chip and the at least one spacer to enhance the stability of the stacked semiconductor package. The at least one spacer and the encapsulation are made from same material to enhance the adhesion between the at least one spacer and the encapsulation to avoid delamination during the reliability test.

To achieve the objective as mentioned above, the packaging method comprising steps of:
 (a) providing a substrate, a first chip and at least one spacer;
 (b) stacking the first chip and the at least one spacer on the substrate via an adhesive layer, wherein at least one gap is formed between the first chip and the at least one spacer;
 (c) stacking a second chip on the first chip and the at least one spacer via an adhesive layer;
 (d) electrically connecting respectively the first chip and the second chip to the substrate; and
 (e) forming an encapsulation on the substrate to encapsulate the first chip, the at least one spacer and the second chip and filling the at least one gap, wherein the material of the encapsulation and the at least one spacer are the same.

From the above description, the at least one spacer is made in advance. The at least one spacer and the encapsulation are made from same material to enhance the adhesion between the at least one spacer and the encapsulation to avoid delamination during the reliability test, and also enhanced the adhesion between the at least one spacer and the adhesive layer of the second chip to enhance the reliability of the stacked semiconductor package.

Other objectives, advantages and novel features of the invention will become more apparent from the following detailed description when taken in conjunction with the accompanying drawings.

BRIEF DESCRIPTION OF THE DRAWINGS

FIGS. 4A to 4G are perspective views of different steps of a fabrication method of spacers in accordance with the present invention.

DETAILED DESCRIPTION OF THE EMBODIMENTS

The present invention is related to a stacked semiconductor package and a packaging method thereof, the features of the present invention are described in detail as fallow.

Figure 1A:
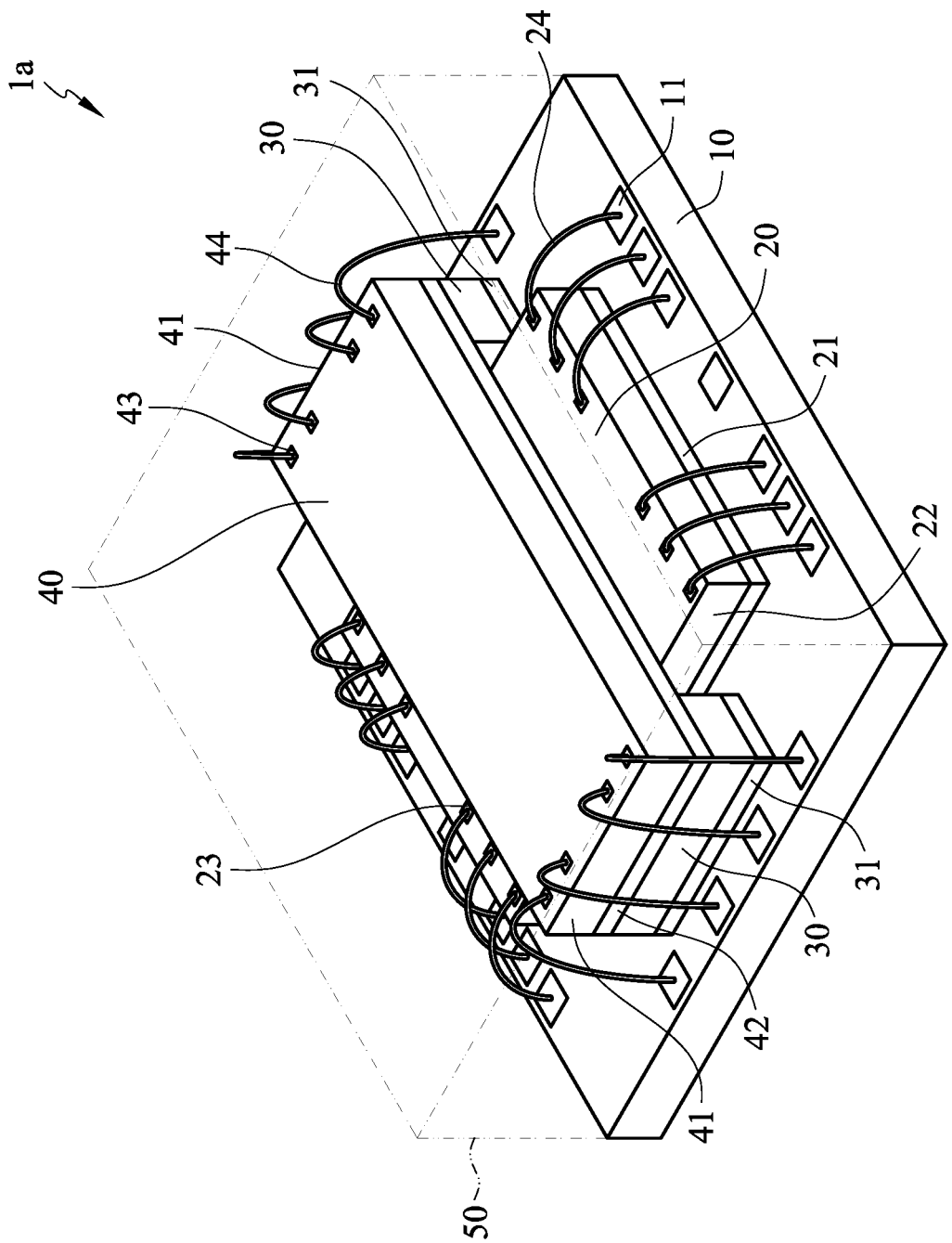
FIG. 1A is a perspective view of a first embodiment of a stacked semiconductor package in accordance with the present invention.
Figure 1B:
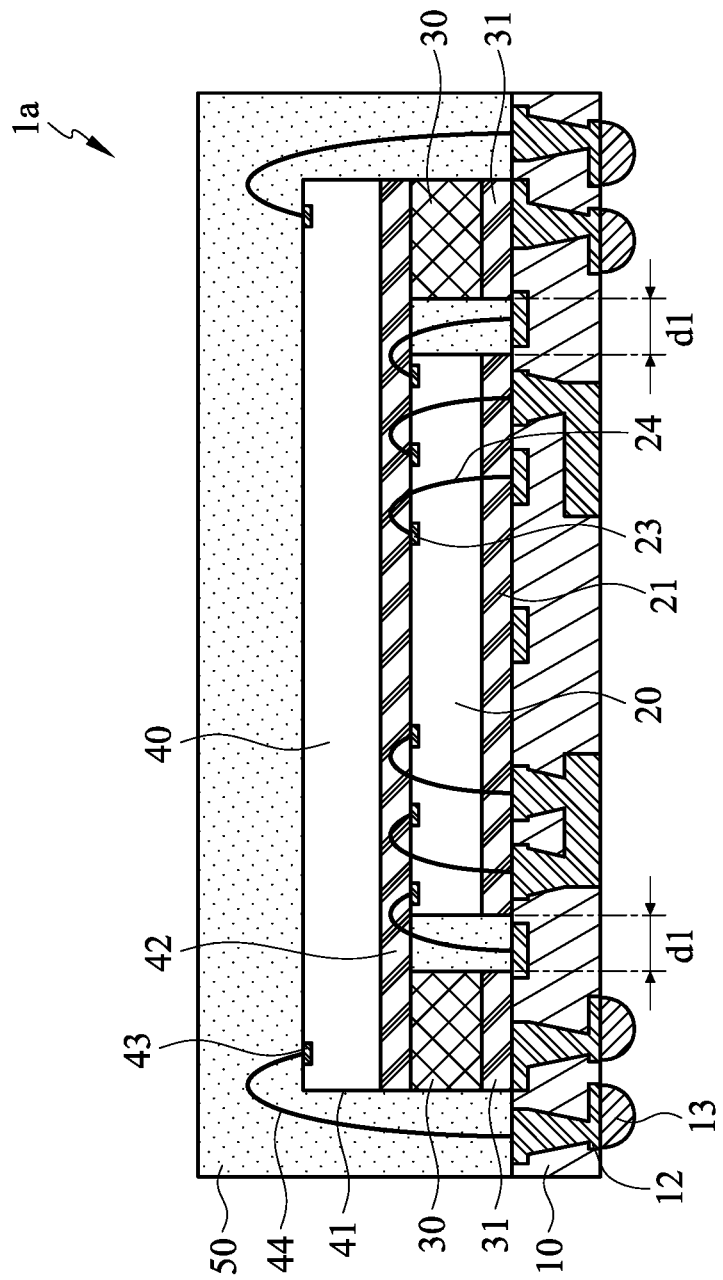
FIG. 1B is a schematic cross-sectional view of the stacked semiconductor package in FIG. 1A.
Figure 1C:
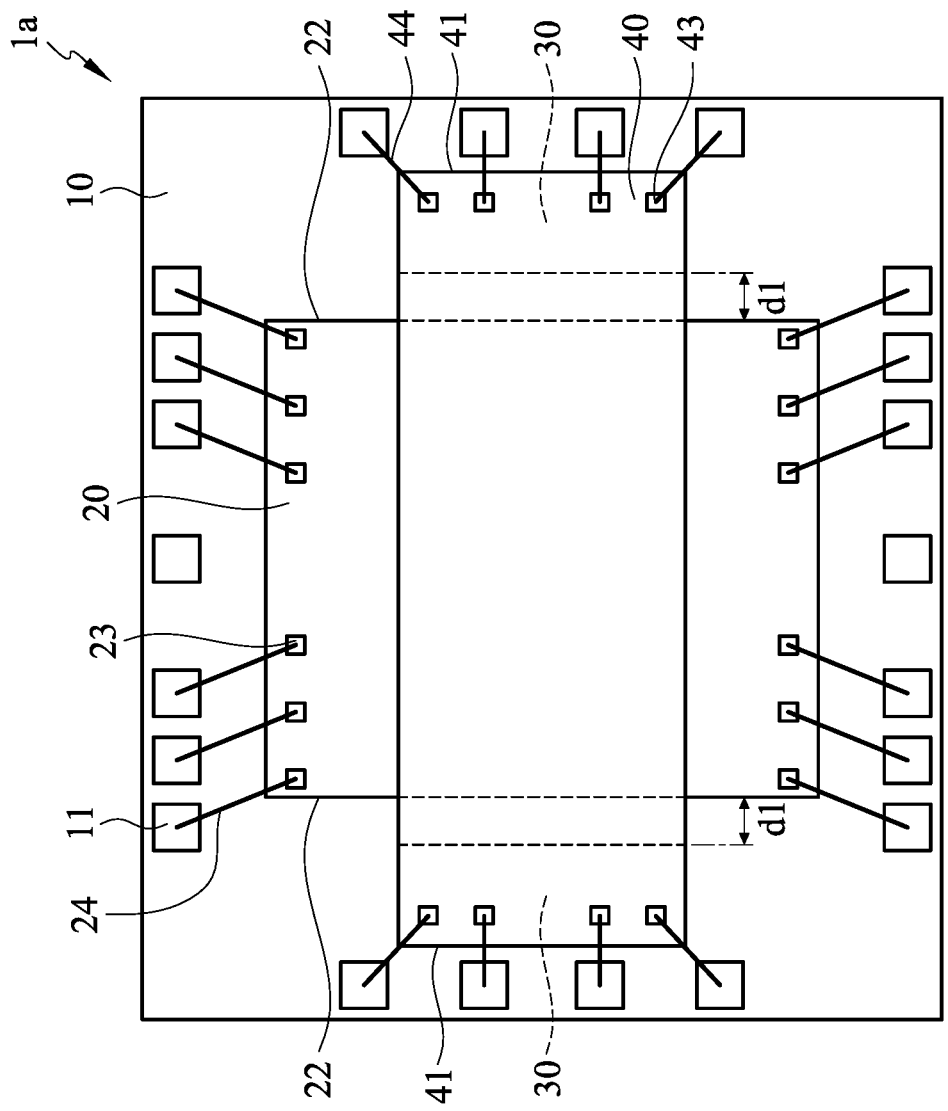
FIG. 1C is a top view of the stacked semiconductor package in FIG. 1A.

With reference to FIGS. 1A, 1B and 1C, a first embodiment of a stacked semiconductor package 1a in accordance with the present invention has a substrate 10, a first chip 20, two spacers 30, a second chip 40 and an encapsulation 50. In this embodiment, the first chip 20 and the second chip 40 are stacked on the substrate 10 crosswise.

The substrate 10 has a plurality of first pads 11 and a plurality of external pads 12 formed respectively on two opposite surface of the substrate 10. The first pads 11 are electrically connected respectively the external pads 12. In this embodiment, the first pads 11 are formed around four side of the substrate 10. Each of the external pads 12 has a solder ball 13 or a metal bump formed thereon.

The first chip 20 is mounted on the substrate 10 via a first adhesive layer 21 and has a plurality of first chip pads 23 formed on a surface of the first chip 20. The first pads 23 are electrically connected respectively to the first pads 11 through a plurality of first wires 24. In this embodiment, the first chip 20 is square. The first chip pads 23 are respectively formed on two opposite sides of the surface of the first chip 20 and are electrically connected respectively to the first pads 11 on the sides of the first chip 20. In one embodiment, the first adhesive layer 21 is a die attach film (DAF).

The two spacers 30 are respectively mounted on two opposite side 22 of the first chip 20. A gap d1 is formed between each of the spacer 30 and a corresponding side 22. In this embodiment, the spacers 30 are respectively mounted on the substrate 10 via a second adhesive layer 31. The spacers 30 are rectangular and have the same thickness with the first chip 20. In one embodiment, the second adhesive layer 31 is a die attach film.

The second chip 40 is stacked on the first chip 20 crosswise. In this embodiment, the second chip 40 is stacked on the first chip 20 and the spacers 30 via a third adhesive layer 42 and has a plurality of second chip pads 43 formed thereon. The second pads 43 are electrically connected respectively to the first pads 11 through a plurality of second wires 44. The second chip 40 is rectangular and has the second pads 43 on two short sides 41, so the second pads 43 are electrically connected respectively to the first pad 11 on the short sides 41. The short sides 41 are respectively stacked on the spacers 30 to expose the first chip pads 23 and are as wide as the spacers 30. In one embodiment, the third adhesive layer 42 is a die attach film.

The encapsulation 50 is formed on the substrate 10 to encapsulate the first chip 20, the spacers 30 and the second chip 40. The gaps d1 are also filled with the encapsulation 50. In this embodiment, the material of the encapsulation 50 and the spacers 30 are the same.

Figure 2A:
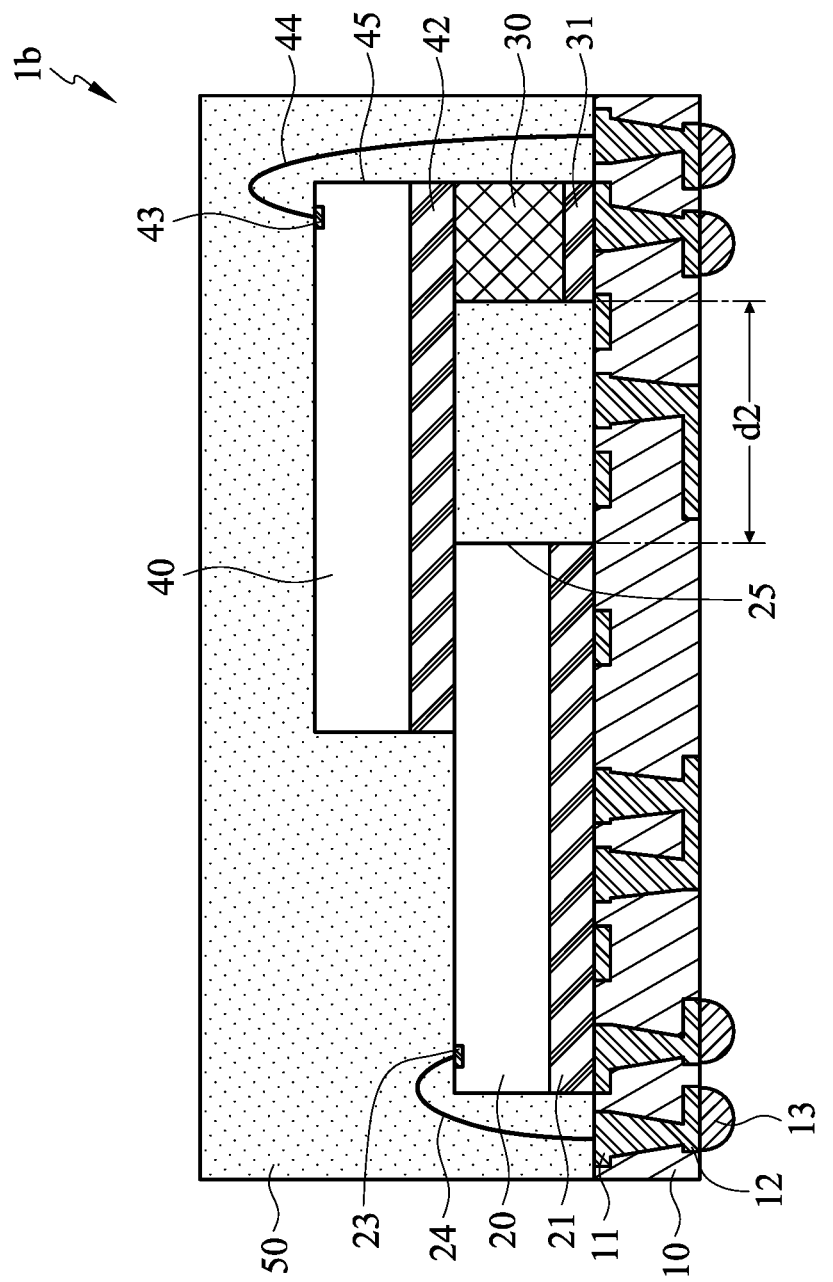
FIG. 2A is a schematic cross-sectional view of a second embodiment of a stacked semiconductor package in accordance with the present invention.
Figure 2B:
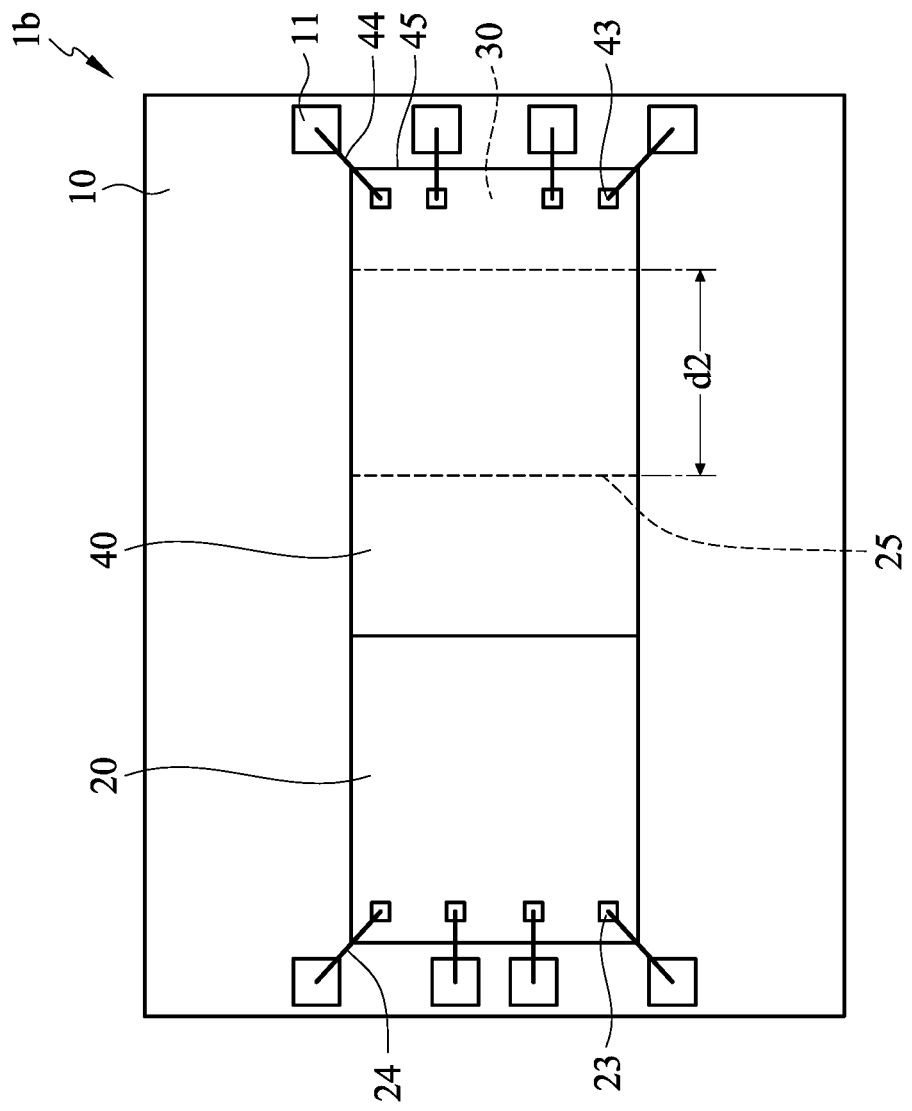
FIG. 2B is a top view of the stacked semiconductor package in FIG. 2B.

With reference to FIGS. 2A and 2B, a second embodiment of a stacked semiconductor package 1b in accordance with the present invention has similar structure with the stacked semiconductor package 1a as shown in FIG. 1A, but the first chip 20 and the second chip 40 have the same size, are stacked on the substrate 10 and misalign with each other. Thus, the second chip 40 has a short side stacked on a short side 25 of the first chip 20 to expose the first chip pads 23 on an opposite short side of first chip 20, so another short side 45 is stacked on the spacer 30. In this embodiment, the spacer 30 is mounted on the substrate 10 near the short side 25. A gap d2 is formed between the spacer 30 and the short side 25. The second chip pads 43 are formed on the short side 45.

With the foregoing description of the embodiment of the present invention, the encapsulation 50 and the spacer 30 have the same material to enhance the adhesion between the encapsulation 50 and the spacer 30, so the stacked semiconductor package 1a, 1b may avoid delamination after the reliability test. The surface of the spacer 30 is rougher than the surface of the conventional silicon spacer 64 because of the material of the spacer 30 and the encapsulation 50 are the same. Thus, the adhesion between the spacer 30 and the third adhesion layer 42 is enhanced to stack the second chip 40 on the spacer 30 stably to avoid delamination. Furthermore, the short sides 41, 45 of the second chip 40 protrude from the side 22 or short side 25 of the first chip 20 to expose the first chip pads 23. Thus, the first chip pads 23 are electrically connected respectively to the first pads 11. The spacer 30 is as thick as the first chip 20 and is as wide as the second chip 40 to stack the second chip 40 stably to avoid die crack.

With reference to FIGS. 3A to 3D, a first embodiment of a packaging method of the stacked semiconductor package comprises following steps (a) to (e).

Figure 3A:
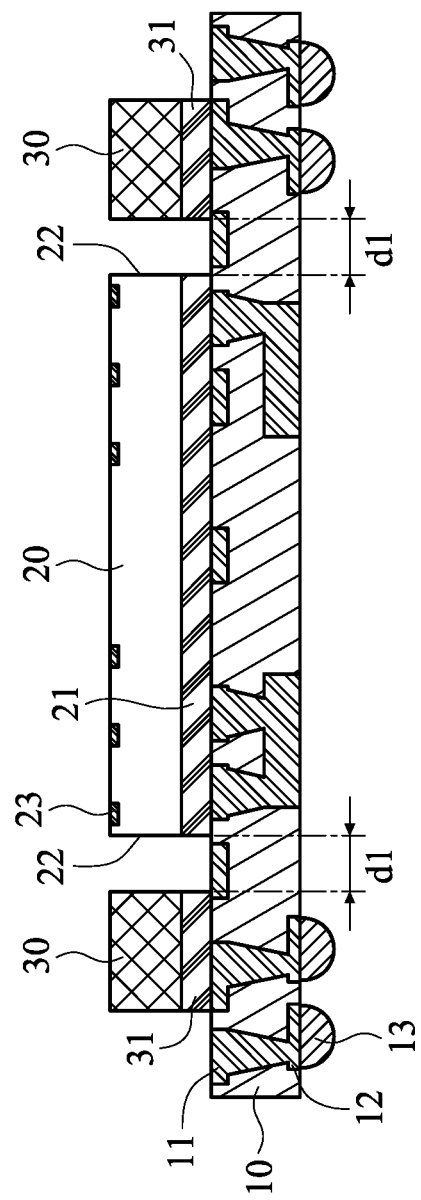
FIGS. 3A to 3D are schematic cross-sectional views of different steps of a package method in accordance with the present invention.

With reference to FIG. 3A, in the step (a), a substrate 10, a first chip 20 and two spacers 30 are provided. In this embodiments, the substrate 10 has a plurality of first pads 11 around an upper surface of the substrate 10 and has a plurality of external pads 12 on a bottom surface of the substrate 10. The first pads 11 are electrically connected respectively to the external pads 12. Each of the external pads 12 has a solder ball or a metal bump formed thereon. The first chip 20 has a plurality of first chip pad 23 formed thereon.

With reference to FIG. 3A, in the step (b), the first chip 20 is stacked on the substrate 10 via a first adhesive layer 21 to expose the first chip pads 23. The spacers 30 are respectively stacked on the substrate 10 via a second adhesive layer 31 near two opposite sides 22 of the first chip 20 and respectively have a gap d1 between the sides 22.

Figure 3B:
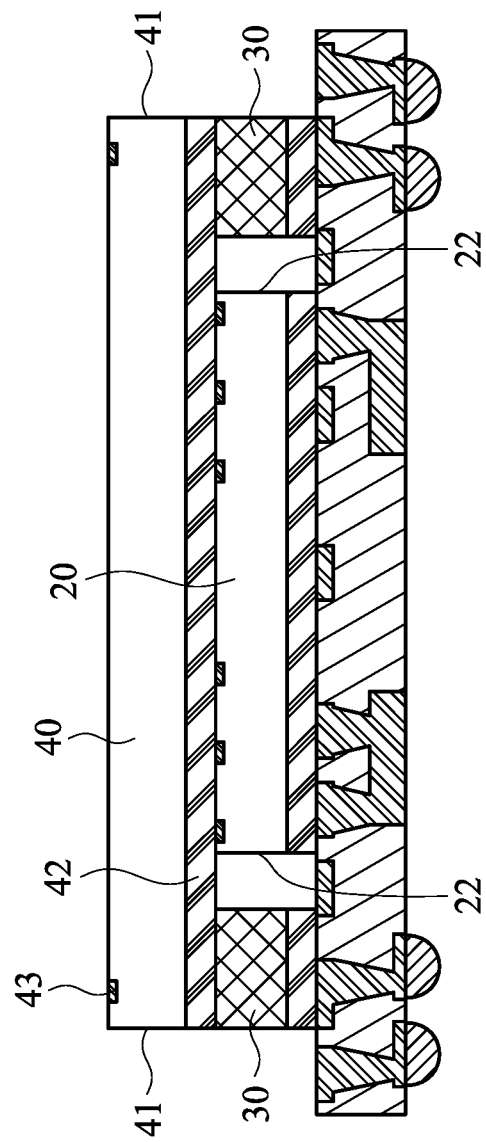

With reference to FIG. 3B, in the step (c), a second chip 40 is crossed on the first chip 20 and is stacked on the first chip 20 and the spacers 30 via a third adhesive layer 42 to expose the first chip pads 23. In this embodiment, the second chip 40 has a plurality of second chip pads 43 formed thereon.

Figure 3C:
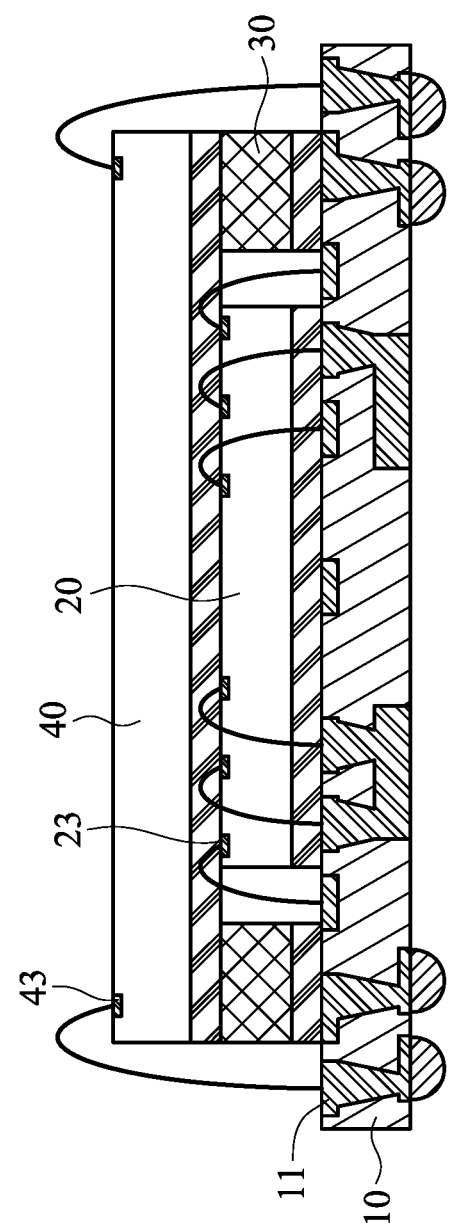

With reference to FIG. 3C, in the step (d), the first chip pads 23 are electrically connected respectively to the first pads 11 of the substrate 10, which respectively correspond two opposite sides of the first chip 20. The second pads 43 are electrically connected respectively to the first pads 11 of the substrate 10, which respectively correspond two opposite side of second chip 40. In this embodiment, the first chip 20 and the second chip 40 are wire bonded to electrically connect to the substrate 10.

Figure 3D:
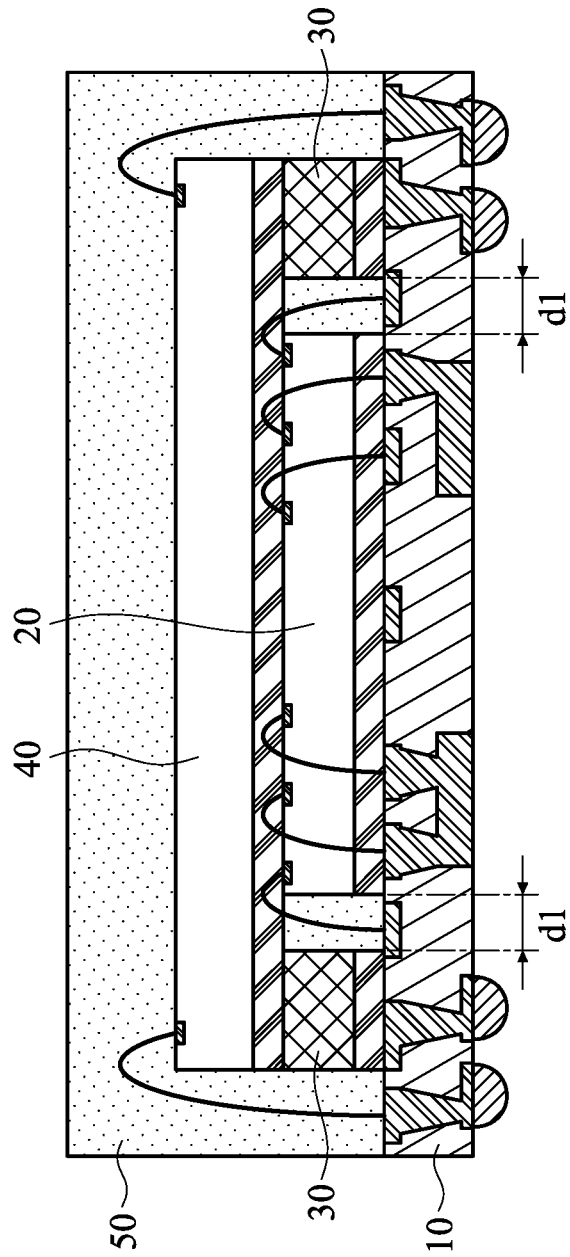
Figure 5:
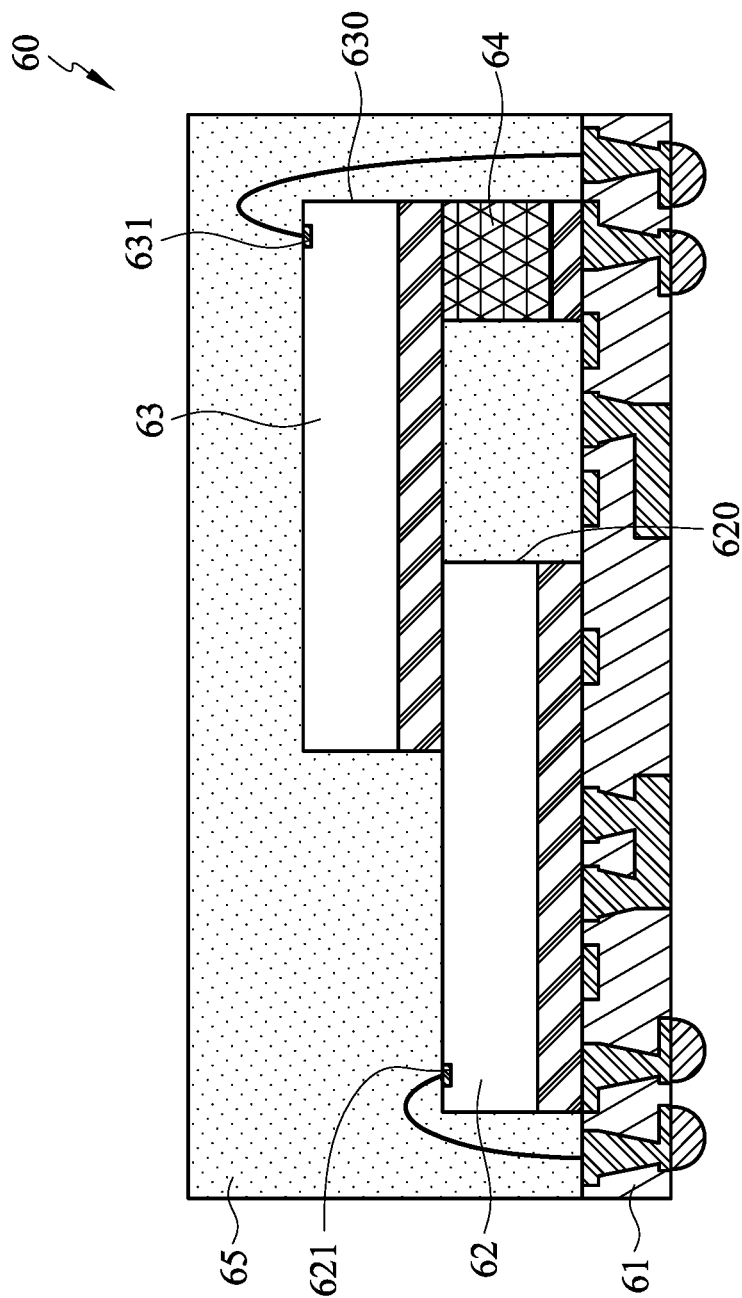
FIG. 5 is a schematic cross-sectional view of a conventional stacked semiconductor package in accordance with the prior art.

With reference to FIG. 3D, in the step (e), an encapsulation 50 is formed on the substrate 10 to encapsulate the first chip 20, the spacers 30 and the second chip 40 to form the stacked semiconductor package. The gaps d1 are also filled with the encapsulation 50. In this embodiment, the encapsulation 50 and the spacers 30 have the same material.

The fabrication method of the spacers 30 are further described as follows.

With reference to FIGS. 4A to 4G, a first embodiment of a fabrication method of the spacers 30 comprises following steps (a1) to (a5).

With reference to FIG. 4A, in the step (a1), a carrier 32 is provided.

With reference to FIG. 4B, in the step (a2), a molding compound 300 is formed on the carrier 32.

With reference to FIG. 4C, in the step (a3), the molding compound 300 has an adhesive layer 310 and a release film 311 formed thereon in sequence.

With reference to FIGS. 4D and 4E, in the step (a4), the molding compound 300 is detached from the carrier 32 and is turned up-side-down to expose a bottom surface. In this embodiment, the molding compound 300 may be polished until the molding compound is as thick as the first chip 20.

With reference to FIGS. 4F and 4G, in the step (a5), the molding compound 300 and the adhesive layer 310 are cut axially from the bottom surface of molding compound 300 to separate the molding compound 300 with the adhesive layer 310 into multiple spacers 30. In this embodiment, the cut molding compound 300', the adhesive layer 310 and the release film 311 are disposed on a pick-up device. A pin 33 of the pick-up device pushes the release film 311 to push the spacer 30 upward. A vacuum suction nozzle 34 of the pick-up device sucks the spacer 30 for using in the manufacturing of the stacked semiconductor package as shown in FIG. 2A. In one embodiment, the spacers 30 may be mounted on the substrate 10 via die bonding process.

In conclusion, the second chip is supported by the first chip and the at least one spacer to enhance the stability of the stacked semiconductor package. The at least one spacer and the encapsulation are made from the same material to enhance the adhesion between the at least one spacer and the encapsulation to avoid forming the delamination during the reliability test, and also enhance the adhesion between the at least one spacer and the adhesive layer of the second chip to enhance the reliability of the stacked semiconductor package. Furthermore, the cost of the at least one spacer is lower than the conventional silicon spacer to decrease the production cost effectively.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A stacked semiconductor package comprising:
   a substrate;
   a first chip mounted on the substrate;
   at least one spacer mounted on the substrate and disposed on at least one side of the first chip;
   at least one gap, each one of the at least one gap formed between a corresponding one of the at least one spacer and a corresponding one of the at least one side of the first chip;
   a second chip mounted on the first chip and the at least one spacer; and
   an encapsulation formed on the substrate to encapsulate the first chip, the at least one spacer and the second chip and filling the at least one gap, wherein the material of the encapsulation and the at least one spacer are the same.

2. The stacked semiconductor package as claimed in claim 1, wherein
   the first chip is mounted on the substrate via a first adhesive layer;
   the at least one spacer is mounted on the substrate via a second adhesive layer; and
   the second chip is mounted on the first chip and the at least one spacer via a third adhesive layer.

3. The stacked semiconductor package as claimed in claim 1, wherein the at least one spacer is as wide as a correspond side of the second chip.

4. The stacked semiconductor package as claimed in claim 1, wherein the at least one spacer is as thick as the first chip.

5. The stacked semiconductor package as claimed in claim 1, wherein
   the substrate has
      two spacers mounted on the substrate, respectively disposed on two opposite sides of the first chip; and
      two gaps respectively formed between the spacers and the corresponding side; and
   the second chip is mounted on the first chip and the two spacers.

6. The stacked semiconductor package as claimed in claim 2, wherein
   the substrate has
      two spacers mounted on the substrate, respectively disposed on two opposite sides of the first chip; and
      two gaps respectively formed between the spacers and the corresponding side; and
   the second chip is mounted on the first chip and the two spacers.

7. The stacked semiconductor package as claimed in claim 3, wherein
   the substrate has
      two spacers mounted on the substrate, respectively disposed on two opposite sides of the first chip; and
      two gaps respectively formed between the spacers and the corresponding side; and
   the second chip is mounted on the first chip and the two spacers.

8. The stacked semiconductor package as claimed in claim 4, wherein
   the substrate has
      two spacers mounted on the substrate, respectively disposed on two opposite sides of the first chip; and
      two gaps respectively formed between the spacers and the corresponding side; and
   the second chip is mounted on the first chip and the two spacers.

9. A packaging method of a stacked semiconductor package comprising steps of:
   (a) providing a substrate, a first chip and at least one spacer;
   (b) stacking the first chip and the at least one spacer on the substrate via an adhesive layer, wherein at least one gap is formed between the first chip and the at least one spacer;
   (c) stacking a second chip on the first chip and the at least one spacer via an adhesive layer;
   (d) electrically connecting respectively the first chip and the second chip to the substrate; and
   (e) forming an encapsulation on the substrate to encapsulate the first chip, the at least one spacer and the second chip and filling the at least one gap, wherein the material of the encapsulation and the at least one spacer are the same.

10. The packaging method as claimed in claim 9, wherein in the step (a), an amount of the at least one spacer is two;
    the step (d) further comprises steps of stacking the two spacers respectively on the substrate via the adhesive and disposing the two spacers respectively near two opposite sides of the first chip; and
    the step (c) further comprises a step of stacking the second chip on the first chip and the two spacers via the adhesive layer.

11. The packaging method as claimed in claim 9, wherein the at least one spacer is fabricated by following steps:

(a1) providing a carrier;
(a2) forming a molding compound on the carrier;
(a3) forming an adhesive layer and a release film on the molding compound in sequence;
(a4) detaching the molding compound from the carrier to expose a bottom surface of the molding compound; and
(a5) cutting the molding compound and the adhesive layer axially from the bottom surface of the molding compound to have the at least one spacer.

12. The packaging method as claimed in claim 10, wherein the two spacers are fabricated by following steps:
(a1) providing a carrier;
(a2) forming a molding compound on the carrier;
(a3) forming an adhesive layer and a release film on the molding compound in sequence;
(a4) detaching the molding compound from the carrier to expose a bottom surface of the molding compound; and
(a5) cutting the molding compound and the adhesive layer axially from the bottom surface of the molding compound to have the two spacers.

13. The packaging method as claimed in claim 11, wherein the step (a4) further comprises a step of polishing the bottom surface of the molding compound until the molding compound is as thick as the first chip.

14. The packaging method as claimed in claim 12, wherein the step (a4) further comprises a step of polishing the bottom surface of the molding compound until the molding compound is as thick as the first chip.

15. The packaging method as claimed in claim 9, wherein in the step (c), the at least one spacer is as wide as a correspond side of the second chip.

16. The packaging method as claimed in claim 10, wherein in the step (c), the two spacers are as wide as a correspond side of the second chip.

* * * * *